(12) United States Patent
Cheng (10) Patent No.: US 6,784,754 B1
(45) Date of Patent: Aug. 31, 2004

(54) VCO RESONANCE TUNING

(75) Inventor: Jackie K. Cheng, Irvine, CA (US)

(73) Assignee: Skyworks,Solutions, Inc., Newport Beach, CA (US)

( * ) Notice: Subject to any disclaimer, the term of this patent is extended or adjusted under 35 U.S.C. 154(b) by 1 day.

(21) Appl. No.: 10/178,406

(22) Filed: Jun. 24, 2002

(51) Int. Cl.[7] .................................................. H03L 7/00
(52) U.S. Cl. .............................. 331/36 L; 331/117 R; 331/167; 331/177 V
(58) Field of Search ........................... 331/36 L, 117 R, 331/167, 177 V, 175, 117 V (56) References Cited

U.S. PATENT DOCUMENTS 6,365,970 B1 * 4/2002 Tsai et al. .................... 257/751

FOREIGN PATENT DOCUMENTS

| EP | 0072593 A | * | 2/1983 | ............. H03L/7/18 |
| JP | 08116212 A | * | 5/1996 | ............. H03B/5/08 |
| JP | 10285023 A | * | 10/1998 | ............. H03L/7/099 |

OTHER PUBLICATIONS

Craninckx et al., A 1.8 GHz CMOS Low–Phase–Noise Voltage–Controlled–Oscillator with Prescaler, IEEE Journal of Solid–State Circuits, vol. 30, No. 12, Dec. 1995.*

* cited by examiner

Primary Examiner—Terry D. Cunningham
Assistant Examiner—Quan Tra
(74) Attorney, Agent, or Firm—Mintz Levin Cohn Ferris Glovsky & Popeo, PC (57) ABSTRACT

Techniques are provided for compensating for variations in capacitance of capacitors used in resonant circuits, particularly varactors used in voltage-controlled oscillators. Indications of actual varactor capacitances are used to determine which of several inductances to use in the resonant circuit with the varactor. The inductances may be composed of a bondwire inductance, and may also be composed of one or more coil inductors. Based on the determined capacitance indication, a bondwire is connected from a common bondpad to a selected bondpad to complete the resonant tank circuit such that an LC product of the tank circuit is within a desired or acceptable LC product range.

26 Claims, 7 Drawing Sheets

VCO RESONANCE TUNING

BACKGROUND OF THE INVENTION

1. Field of the Invention

The invention relates to resonant circuits and in particular to voltage-controlled oscillators.

2. Background of the Invention

Voltage-Controlled Oscillators (VCOs) are used in many systems, such as communications systems and computers, where frequencies are synthesized. Frequency synthesis can be used, e.g., to provide a carrier frequency for a signal in a communications system such as a radio transceiver.

VCOs are configured to have an oscillation, or resonant, frequency. For oscillation frequencies higher than about 1 GHz, typically LC oscillators are used because they have low noise and are relatively stable. LC oscillators typically use a tank circuit including an inductance (L) and a capacitance (C) connected in series or in parallel to provide a resonant circuit. The oscillation frequency of the LC tank depends on a product of the inductance and capacitance (the LC product) of the tank.

A control voltage called the tuning voltage is used in a VCO to adjust the oscillation frequency. The oscillation frequency can also be adjusted by varying the capacitance of the tank using the tuning voltage. This may be accomplished by implementing the tank capacitor as a varactor, whose capacitance varies with the tuning voltage. The tuning voltage has a range of voltages that can be provided, corresponding to a range of capacitances that can be provided. This range of capacitances corresponds to a range of frequencies producible by the LC tank. The varactor is typically designed to have a desired nominal capacitance, so that the LC tank will oscillate at a desired frequency, when the tuning voltage is at a nominal voltage. The nominal voltage will be approximately in the middle of the tuning voltage range if the change in oscillation frequency is linear relative to the change in tuning voltage.

SUMMARY

A number of technical advances are achieved in the art, by implementation of an LC VCO for compensating variances in capacitance of an LC tank of the VCO. The LC VCO may be broadly conceptualized as a system in which the inductive portion of an LC tank of the VCO is selectively adjusted, thus helping to ensure that an LC product of the LC tank is within a desired range to help ensure that the VCO can output a desired frequency or frequencies.

For example, an LC VCO may utilize a system architecture in which inductance is adjusted to compensate for variances between actual capacitance and designed/desired capacitance to achieve a desirable LC product. An implementation of the system architecture may include selectable inductances for connection to a capacitor of an LC tank of the VCO. Inductances of different values can be connected to the capacitor to effectively alter the capacitance, by actually altering the LC product. The different inductance values can be provided by different lengths of bondwire, or by different-valued, coils, inductors and the like, or by combinations of these techniques.

Other systems, methods, features and advantages of the invention will be or will become apparent to one with skill in the art upon examination of the following figures and detailed description. It is intended that all such additional systems, methods, features and advantages be included within this description, be within the scope of the invention, and be protected by the appended claims.

BRIEF DESCRIPTION OF THE FIGURES

The invention can be better understood with reference to the following figures. Components in the figures are not necessarily to scale, emphasis instead being placed upon illustrating the principals of the invention.

A detailed description of the invention as illustrated in the figures will now be provided. While the invention will be described in connection with these figures, there is no intent to limit the invention to the embodiment or embodiments disclosed in these figures. On the contrary, the intent is to cover all alternatives, modifications, and equivalents included within the spirit and scope of the invention as defined by the appended claims.

DETAILED DESCRIPTION OF PREFERRED EMBODIMENTS

Figure 1:
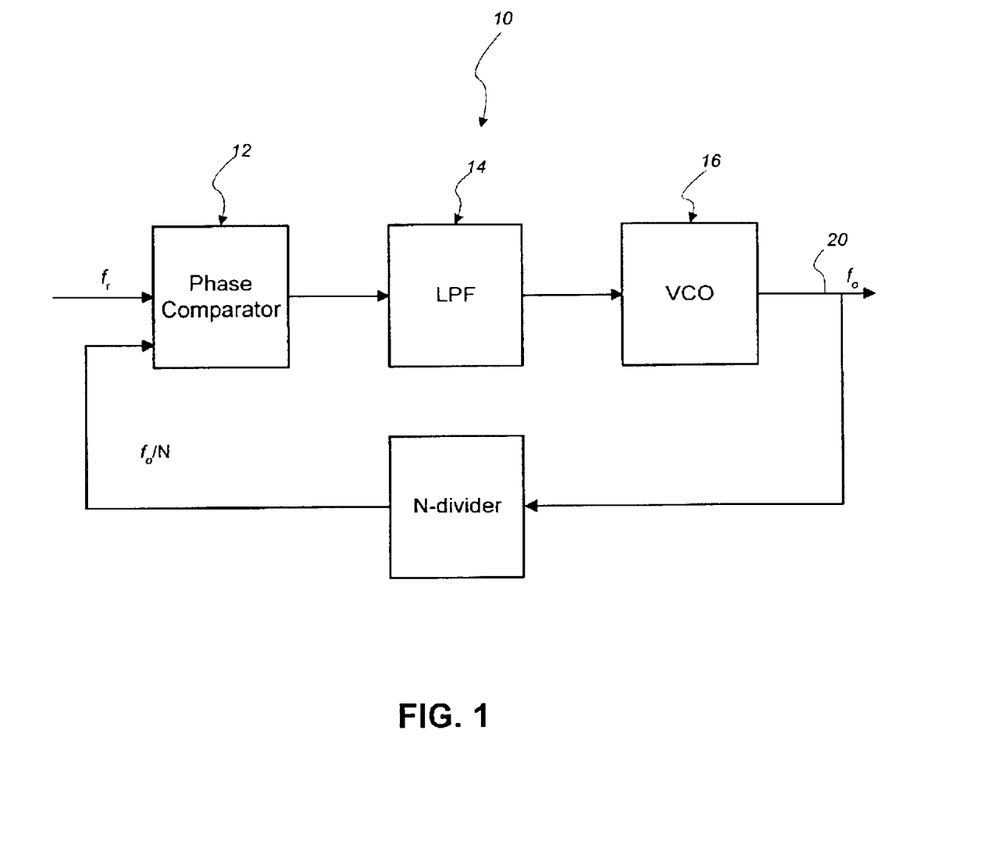
FIG. 1 is a schematic block diagram of a phase-locked loop circuit including a voltage-controlled oscillator.

Referring to the embodiment of FIG. 1, a typical phase-locked loop (PLL) system 10 is illustrated that includes a phase comparator 12, a low-pass filter (LPF) 14, a voltage-controlled oscillator (VCO) 16, and an N-divider 18. As shown, the phase comparator 12 receives a reference signal having a reference frequency $f_r$, and a feedback signal having a frequency $f_o/N$. The comparator 12 compares the reference and feedback signals and outputs a DC signal, indicative of a difference in phase between the reference and feedback signals, to the LPF 14. The LPF 14 filters the output signal from the comparator 12 and outputs the filtered signal to the VCO 16. The VCO 16 uses the signal from the LPF 14 to adjust a frequency $f_o$ of an output signal of the VCO 16. The VCO's output signal is output on a line 20 and is also fed back to the N-divider 18. The N-divider 18 divides the frequency $f_o$ of the VCO's output signal by a factor N, and outputs a signal having a frequency $f_o/N$ to the phase comparator 12. The adjustment of the VCO's output signal frequency $f_o$ continues so that the output frequency $f_o$ locks to a desired frequency that is related to the reference frequency $f_r$ by the factor N.

Figure 2:
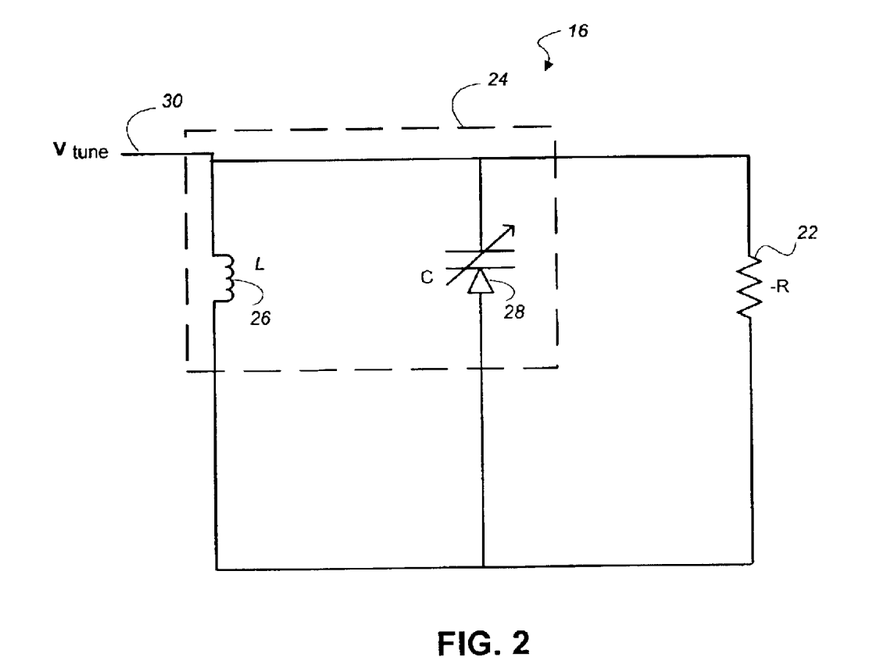
FIG. 2 is a schematic circuit diagram of the voltage-controlled oscillator, shown in FIG. 1, including an LC tank.

Referring to the embodiment of FIG. 2, the VCO 16 may be implemented using an active device 22 having a negative resistance −R, and an LC tank 24. The LC tank 24 includes an inductive element 26, having an inductance L, and a varactor 28 having a variable capacitance C. The varactor's capacitance C may be varied by a tuning voltage $V_{tune}$ received by an input 30 that is coupled to the varactor 28. The varactor 28 may be implemented as a reverse-biased diode. The varactor 28 is shown coupled in parallel with the inductive element 26, although other couplings, such as a serial coupling, may be employed. Also, the inductive element 26 is shown as a single inductor, but the element 26 may be a combination of multiple inductive apparatus, e.g., coupled in serial, or parallel, or combinations of serial and parallel connections.

Figure 3:
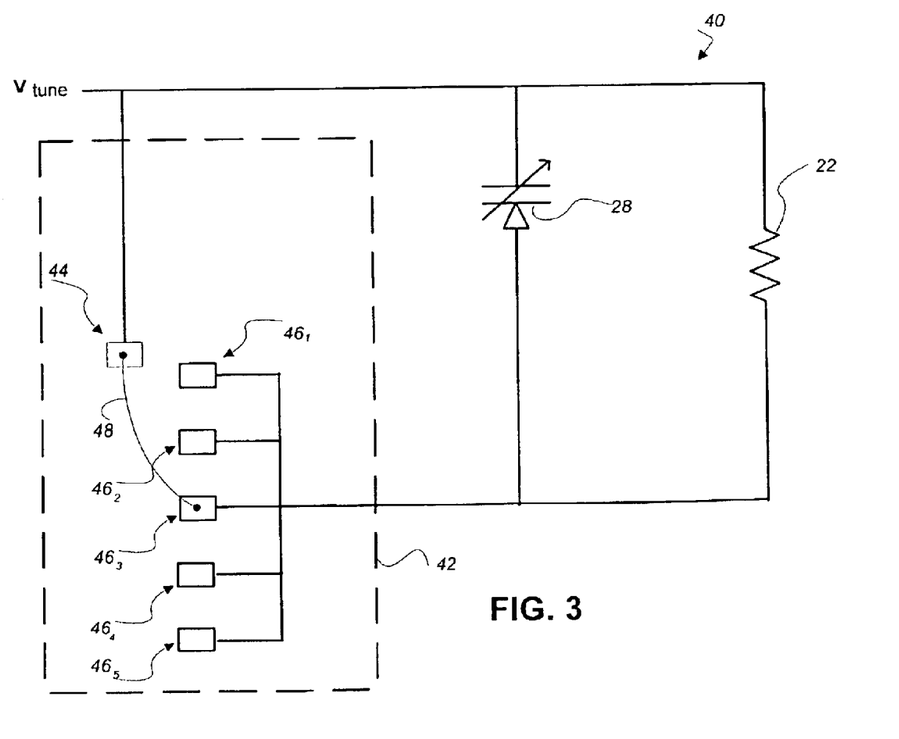
FIG. 3 is a schematic circuit diagram of a voltage-controlled oscillator using a variable inductance arrangement for an LC tank.

Referring to FIG. 3, a VCO 40 includes an inductance arrangement 42 for the inductive element 26 of FIG. 2, the varactor 28, and the active device 22. In a preferred embodiment, each of the components 22, 28, and 42 are formed on a semiconducting die or chip. By forming the varactor 28 on a semiconducting chip, manufacturing tolerances, e.g., process variations, affect a nominal capacitance $C_{nom}$ of the varactor 28, resulting in a tolerance range of nominal varactor capacitance $C_{nom}$ due to the manufacturing tolerances. Thus, on a given wafer, varactors 28 on different chips may provide different actual nominal capacitances $C_{nom-act}$ when subjected to the same bias and tuning voltages. The same is true for varactors 28 on different wafers, and on wafers in different batches of wafers. To help compensate for the variance in the varactor's actual nominal capacitance $C_{nom-act}$ relative to a designed/desired nominal varactor capacitance $C_{nom-des}$, the inductance arrangement 42 provides for different inductances to be selectively coupled to the varactor 28.

In at least this embodiment, the inductance arrangement 42 includes a common bondpad 44, five selectable bondpads $46_1$–$46_5$, and a bondwire 48. The bondwire 48 is connected from the common bondpad 44 to one of the selectable bondpads 46, here bondpad $46_3$. The bondwire 48 has an inductance that is dependent on its length and the selectable bondpads 46 are each disposed at different distances relative to the common bondpad 44 such that the bondwire length, and thus inductance, depends upon to which selectable bondpad 46 the bondwire 48 is connected. The distances from the common bondpad 44 to the selectable bondpads 46 are arranged such that an inductance range of the corresponding bondwires 48 will help to compensate for the tolerance range of the varactor's nominal capacitance $C_{nom}$. The inductances providable by the arrangement 42 are much more precise/reliable than the varactor capacitance C.

The number of, and distances from the common bondpad to, the selectable bondpads 46 are designed to provide a sufficiently broad range of compensation and sufficiently fine resolution to appropriately compensate for any actual nominal varactor capacitance $C_{nom-act}$ within the expected tolerance range. The range of compensation is broad enough so that an LC product of the inductance L of the inductive element 26 (FIG. 2) and the nominal varactor capacitance $C_{nom}$ at either extreme of the tolerance range can be brought within a desired, or at least acceptable, range of LC product values. The resolution is such that an effective nominal capacitance $C_{nom-eff}$ can be adjusted from any value within the tolerance range to within the acceptable capacitance range such that the LC product is within the acceptable LC product range. Thus, a center frequency of oscillation of the tank will be within an acceptable range of frequencies.

The following provides a design example for the bondpads 46. Suppose the actual nominal varactor capacitance $C_{nom-act}$ can vary ±10% from the designed nominal varactor capacitance $C_{nom-des}$, and an acceptable range is ±2.5% of $C_{nom-des}$. In this case, the inductance arrangement needs to be configured to effectively adjust the nominal varactor capacitance $C_{nom}$ (i.e., adjust an effective nominal varactor capacitance $C_{nom-eff}$) from either −10% or +10% of design to between −2.5% and 2.5% of designed nominal capacitance $C_{nom-des}$.

The location of the selectable bondpad $46_3$ (assuming five bondpads 46 will be used) may be chosen first. The location of the selectable bondpad $46_3$ is chosen such that an inductance $L_3$ of the bondwire 48 from bondpad 44 to bondpad $46_3$ is a desired inductance $L_{des}$, where the LC product $L_{des}C_{nom-des}$ yields a desired (and possibly ideal) LC product (an LC product within a desired range and possibly equal to an ideal value).

Locations of extreme bondpads are designed in accordance with the nominal varactor capacitance tolerance range and acceptable range. Bondpad $46_1$ is located such that a bondwire inductance $L_1$ will adjust the effective capacitance $C_{nom-eff}$ from the lower end of the tolerance range $C_{tol-min}$= 0.9$C_{nom-des}$, to the lower limit of the acceptable range $C_{acc-min}$=0.975$C_{nom-des}$. In this case, the inductance $L_1$= $(C_{acc-min}/C_{tol-min})L_3$=(0.975/0.9)$L_3$, or approximately 1.083$L_3$. Similarly, bondpad $46_5$ is located such that a bondwire inductance L5 will adjust the effective capacitance $C_{nom-eff}$ from the upper end of the tolerance range $C_{tol-max}$= 1.1$C_{nom-des}$, to the upper limit of the acceptable range $C_{acc-max}$=1.025$C_{nom-des}$. In this case, the inductance $L_5$= $(C_{acc-max}/C_{tol-max})L_3$=(1.025/1.1)$L_3$, or approximately 0.932$L_3$.

Intermediate bondpad locations, if needed or desired, are chosen to compensate for actual nominal capacitances $C_{nom-act}$ between the extremes of the tolerance range, especially capacitances that cannot be compensated for by the boundary inductances $L_1$ and $L_5$. For example, the effective capacitance $C_{nom-eff}$ will not be within the acceptable range of ±2.5% of $C_{nom-des}$ if $L_1$ is used and $C_{nom-act} \geq (C_{acc-max} * C_{tol-min}/C_{acc-min})$=(1.025*0.9/0.975) $C_{nom-des} \approx 0.946 C_{nom-des}$. Thus, using a maximum of 0.94$C_{nom-des}$ for safety, the bondpad $46_2$ can be located such that $L_2$=($C_{acc-min}$/0.94$C_{nom-des}$)$L_3$=(0.975/0.94)$L_3$≈1.037$L_3$. The inductance $L_2$ can compensate actual capacitances $C_{nom-act}$ of 0.94$C_{nom-des}$ or greater into effective capacitances $C_{nom-eff}$ that are within the acceptable capacitance range until $C_{nom-des} \geq (C_{acc-max}/X) = (1.025/1.037)$ $C_{nom-des} \approx 0.988 C_{nom-des}$, where X=$L_1$/$L_3$. As the maximum capacitance for which $L_2$ can be used is within the acceptable range, no more bondpads with inductances between $L_1$ and $L_3$ are needed. Similarly, the effective capacitance $C_{nom-eff}$ will not be within the acceptable range of ±2.5% of $C_{nom-des}$ if $L_5$ is used and $C_{nom-acc} \geq (C_{acc-min} * C_{tol-max}/C_{acc-max})$=(0.975*1.1/1.025) $C_{nom-des} \approx 1.046 C_{nom-des}$. Thus, using a maximum of 1.05$C_{nom-des}$ for safety, the bondpad $46_4$ can be located such that $L_4$=($C_{acc-max}$/1.05$C_{non-des}$)$L_3$=(1.025/1.05)$L_3$≈0.976$L_3$. The inductance $L_4$ can compensate actual capacitances $C_{nom-act}$ of 1.05$C_{nom-des}$ or less into effective capacitances $C_{nom-eff}$ that are within the acceptable capacitance range until $C_{nom-act} \geq (C_{acc-min}/Y) = (0.975/0.976)$ $C_{nom-des} \approx 0.999 C_{nom-des}$, where Y=$L_1$/$L_3$. As the minimum capacitance for which $L_4$ can be used is within the acceptable range, no more bondpads with inductances between $L_5$ and $L_3$ are needed. Thus, the assumption of five selectable bondpads 46 was correct. Other numbers of bondpads 46 could be used to provide finer resolution if desired.

Predetermined categories of deviations of the actual capacitance $C_{nom-act}$ relative to the desired/designed nominal varactor capacitance $C_{nom-des}$ are associated with the selectable bondpads 46. The associations are based on knowledge of the inductances designed to be provided by bondwire connections to the various selectable bondpads 46. For example, continuing the above example, selectable bondpads $46_1$, $46_2$, $46_3$, $46_4$, and $46_5$ can be associated with actual capacitances $C_{nom-act}$ in the ranges $0.9$–$0.94C_{nom-des}$, $0.94$–$0.975C_{nom-des}$, $0.975$–$1.025C_{nom-des}$, $1.025$–$1.05C_{nom-des}$, and $1.05$–$1.1C_{nom-des}$, respectively.

Figure 4:
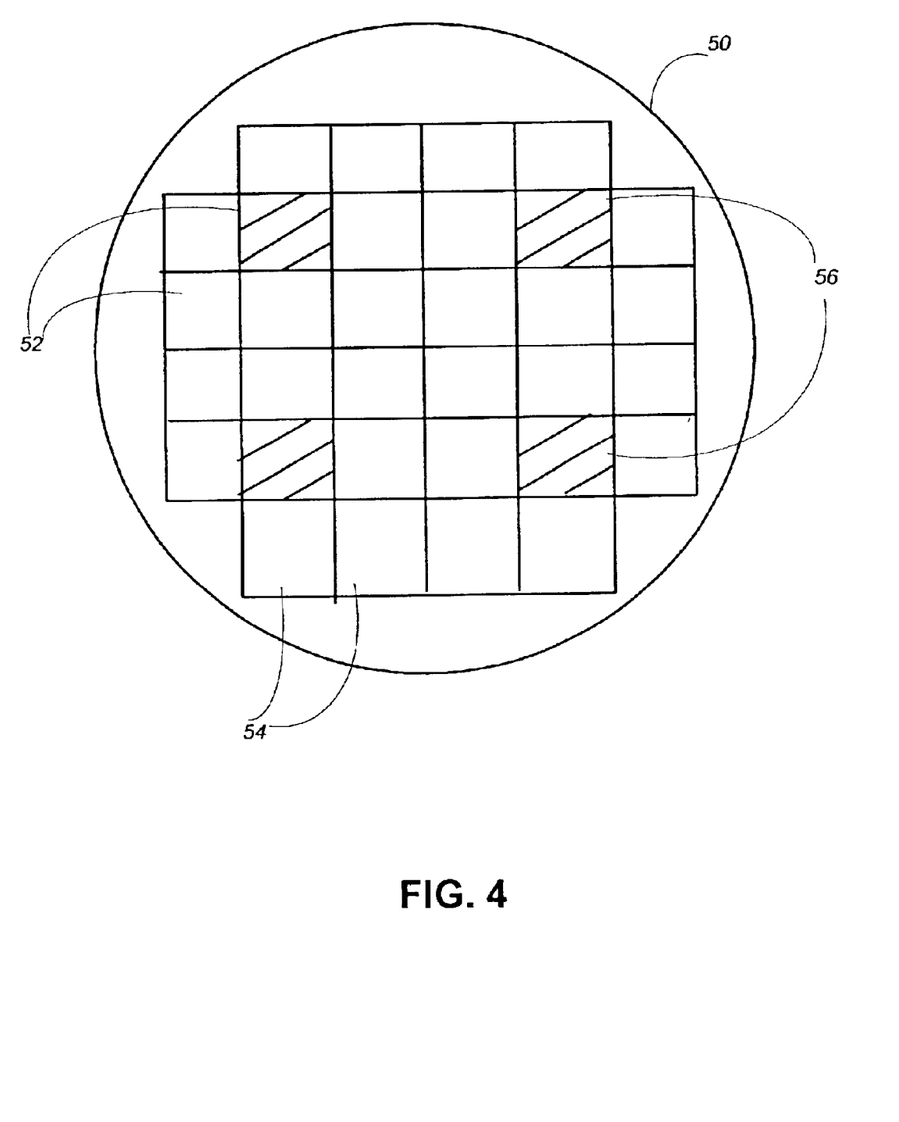
FIG. 4 is a schematic diagram of a wafer including multiple semiconducting chips.

Referring to FIG. 4, a wafer 50 includes many semiconducting dies or chips 52, including operational chips 54 and test chips 56. The operational chips 54 may include the PLL circuit 10 (FIG. 1) that includes the VCO 40 (FIG. 3). The test chips 56 each include test circuitry for use in determining indicia of the actual nominal varactor capacitance $C_{nom-act}$ of the operational chips 54 relative to the designed capacitance $C_{nom-des}$. The test circuitry includes at least one varactor, preferably with similar design to the VCO varactors of the operational chips 54 neighboring each test chip 56. Test pads are coupled to the test chip varactors that can be probed with DC probes attached to test equipment for determining the actual capacitances $C_{nom-act}$ of the varactors on the test chips 56. These capacitances serve as indications of the manufacturing variance and thus of the actual varactor capacitances $C_{nom-act}$ for operational chips 54 in the area of respective test chips 56. As the actual capacitance $C_{nom-act}$ can be different for similarly-designed varactors in different areas of the wafer 50, the test chips 56 are disposed strategically about the wafer 50 to help accurately determine the variance in the actual nominal varactor capacitance $C_{nom-act}$ for each of the operational chips 54.

Figure 5:
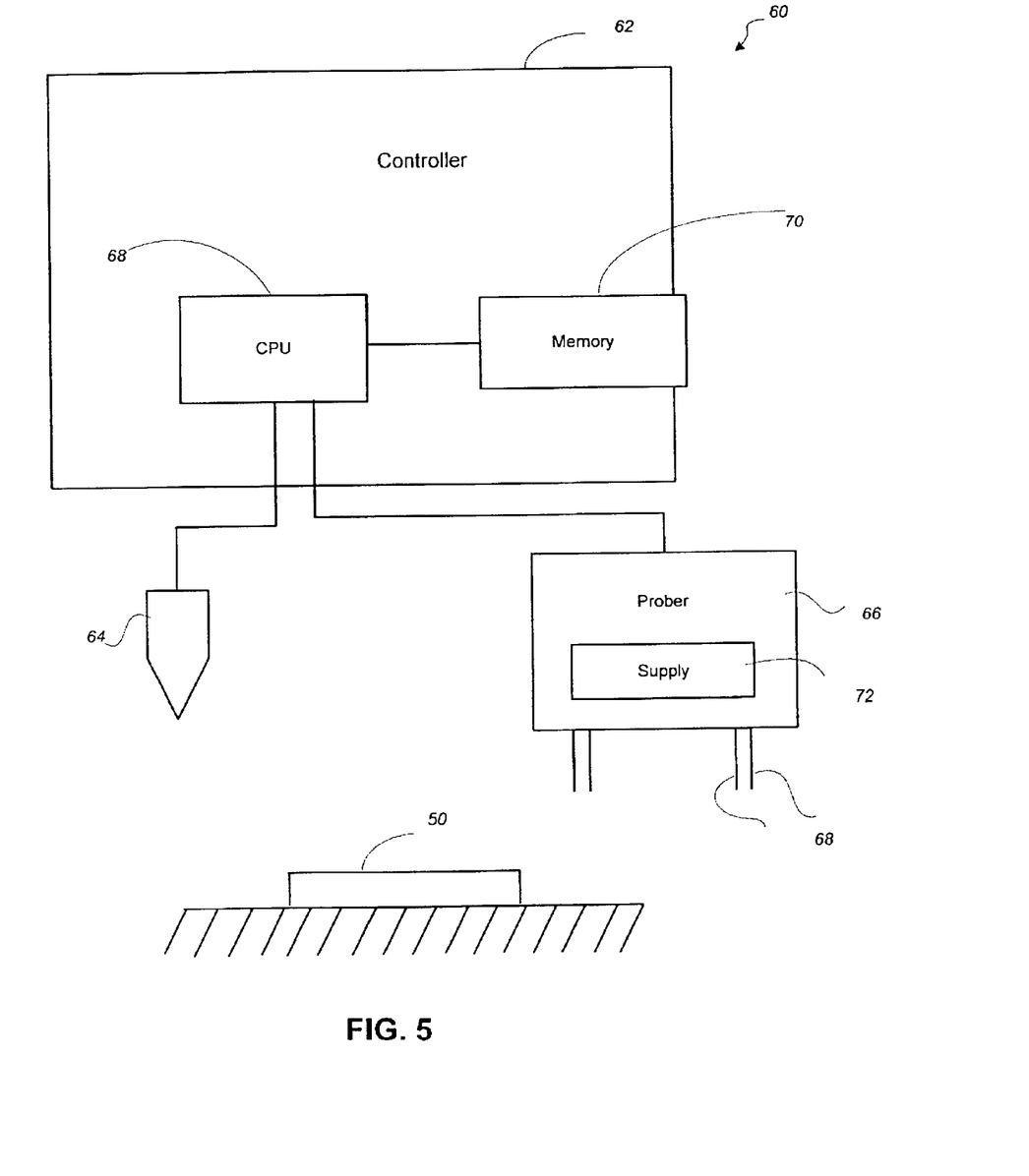
FIG. 5 is a schematic diagram of a system for attaching bondwires as part of the LC tank shown in FIG. 3.

Referring also to FIG. 5, a bondwire machine 60 for determining which selectable bondpad 46 to bond to and for connecting the common bondpad 44 to a selectable bondpad 46 includes a controller 62, a wiring device 64, and a prober 66. The controller 62 is a computer such as a personal computer and includes a central processing unit (CPU) 68 and memory 70. The memory 70 is coupled to the CPU 68 and may include, e.g., random-access memory (RAM), read-only memory (ROM) hard and/or floppy disc drives. Stored in the memory 70 are software instructions that when executed by the CPU 68 may cause the CPU 68 to instruct or otherwise cause the wiring device 64 and the prober 66 to perform various operations. For example, the wiring device is configured to, under control of the controller 62, connect bondpads 44 and 46 with a bondwire. The prober 66 is configured to help determine indicia of actual capacitances of varactors of the test chips 56 of the wafer 50.

In at least one embodiment, to help determine indicia of actual nominal capacitances of varactors on the wafer 50, the prober 66 includes probes 68 and a DC power supply 72. The probes are disposed and configured to contact test pads coupled to the varactors of the test chips 56 when the prober 66 (or a probe card connected to the prober 66) is moved, under control of the controller 62, into contact with the wafer 50. The power supply 72 can supply DC power to the varactors, and the CPU 68 (or a processor in the prober 66) can use response signals received through the probes 68 to determine the actual capacitances of the varactors of the test chips 56.

The CPU 68 may use a difference between the actual nominal capacitances $C_{nom-act}$ and the designed nominal capacitances $C_{nom-des}$ of the test chip varactors to select a appropriate selectable bondpads 46 and to control the bondwire device 64 to connect the common bondpad 44 to the selected bondpads 46. The CPU 68 may access a table or database stored in the memory 70 relating the designed/actual capacitance differences with selectable bondpads 46. The relation can be of indicia other than this capacitance difference. For example, the relations could be of just the actual nominal capacitance $C_{nom-act}$. The CPU 68 uses the associated bondpad 46 for all chips 54 in a predetermined area of the test chip 56, which may be different for different test chips 56 and therefore for different operational chips 54 in different areas of the wafer 50. Instructions may be issued by the CPU 68 to cause the bondwire device 64 to wire bond the common bondpad 44 to the appropriate selectable bondpad 46 for each operational chip 54.

Referring to 6, with further reference to FIGS. 1–5, a process 80 of manufacturing the PLL 10 includes stages 82, 84, 86, and 88 as shown. The stages and order of the stages shown are exemplary only and not meant to be limiting. Stages may be added, removed, or rearranged without departing from the scope of the invention.

Figure 6:
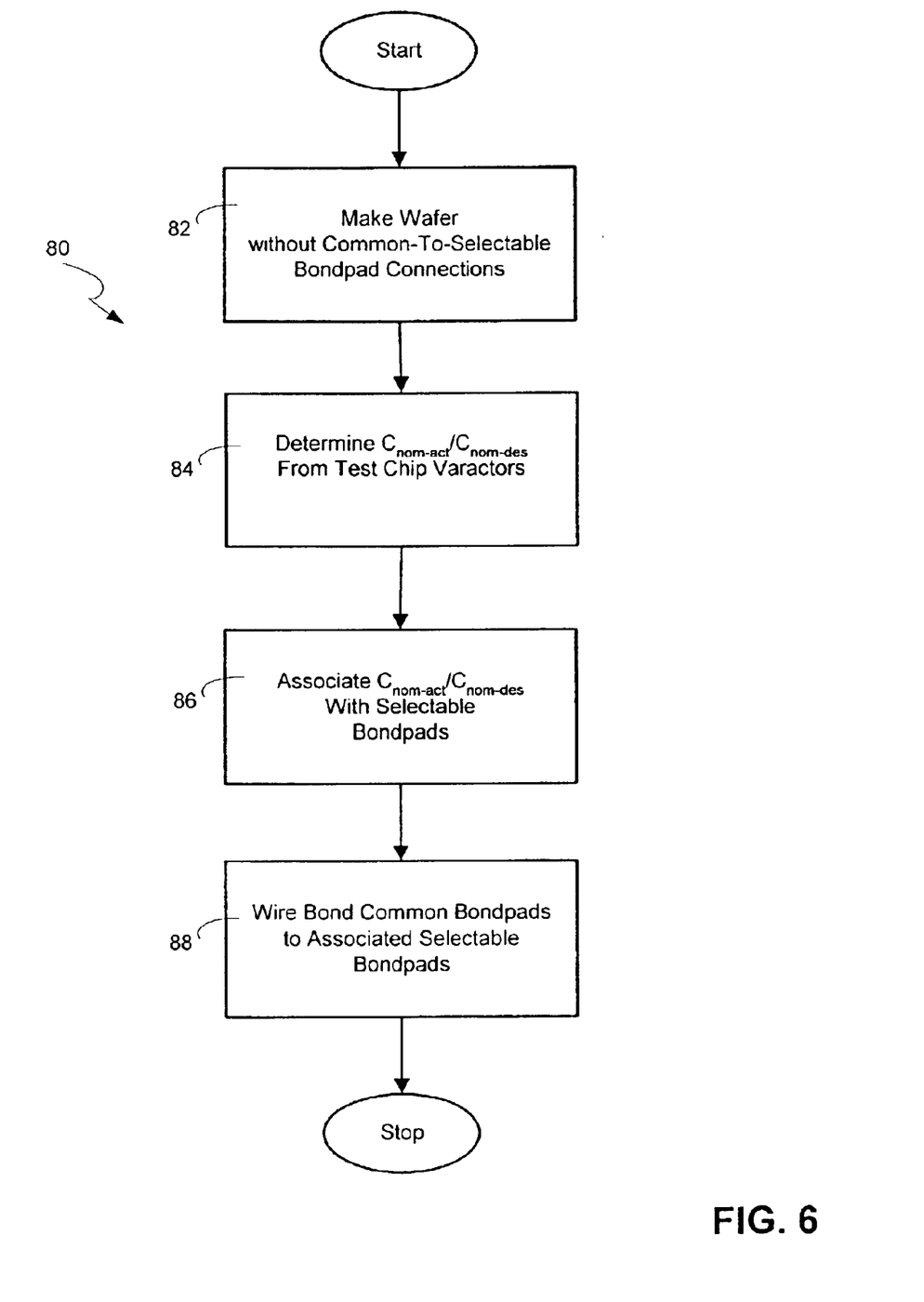
FIG. 6 is a block flow diagram of a process of adjusting an inductance of any of the LC tank shown in FIG. 3.

At stage 82, the wafer 50 is manufactured with the operational chips 54 and the test chips 56. The operational chips 54 lack at least connections between the common bondpad 44 and the selectable bondpads 46.

At stage 84, differences between the actual nominal capacitances $C_{nom-act}$ and the designed nominal capacitances $C_{nom-des}$ of the varactors of the test chips 56 are determined. As shown, the difference may be a ratio, although other ways of determining differences/relationships are possible, such as by subtracting. The CPU 68 executes instructions and causes the prober 66 to cause the probes 68 to contact test pads connected to the test chip varactors. Under control of the CPU 68, the prober DC reverse biases the varactors to the nominal value. Responses to the nominal biases are used by the CPU 68 to determine indicia of the actual nominal capacitances $C_{nom-act}$. The actual nominal capacitances $C_{nom-act}$ are compared to the designed nominal capacitance $C_{nom-des}$ and the relationship between the actual capacitances $C_{nom-act}$ and the desired/designed capacitances $C_{nom-des}$ are determined for the test chip varactors.

At stage 86, the CPU 68 associates the differences between actual and designed nominal capacitances to selectable bondpads 46. The CPU 68 accesses the memory 70 for stored relationships between capacitance differences and selectable bondpads 46. For each test chip 56, the CPU 68 determines which selectable bondpad 46 to use for operational clips 54 associated with each test chip 56.

At stage 88, the CPU 68 controls the bondwire device 64 to wire bond the common bondpad 44 to the selected bondpad 46 for each operational chip 54. The CPU 68 causes the device 64 to produce the bondwire 48 connecting the common bondpad 44 to the selectable bondpad 46 that is appropriate for that operational chip 54. The appropriate bondpad 46 is potentially different from chip 54 to chip 54 based on the area of the wafer 50.

Other embodiments are within the scope and spirit of the appended claims. For example, bondwire connections can be made to more than one selectable bondpad 46 (FIG. 2). Bondwire connections can be made from the common bondpad 44 to multiple selectable bondpads 46. This can be used, e.g., to provide finer resolution than connecting to a single selectable bondpad 46 only. Referring to FIGS. 3–5, the bondwire machine 60 can be programmed directly as to which selectable bondpad 46 to connect to the common bondpad 44. This could be done by a person that measures the actual capacitances and programs the controller 62 based upon know relationships between actual capacitance and desired selectable bondpads 46. This technique could be used instead of providing the actual capacitance of a varactor on a test chip 54 through the prober 66 and having the bondwire machine 60 determine which selectable bondpad 46 to use. Also, the length of the bondwire between two bondpads could be varied, while ensuring that the bondwire fits inside the chip package, to adjust the inductance. Still other embodiments are possible, such as those shown in FIGS. 7 and 8.

Figure 7:
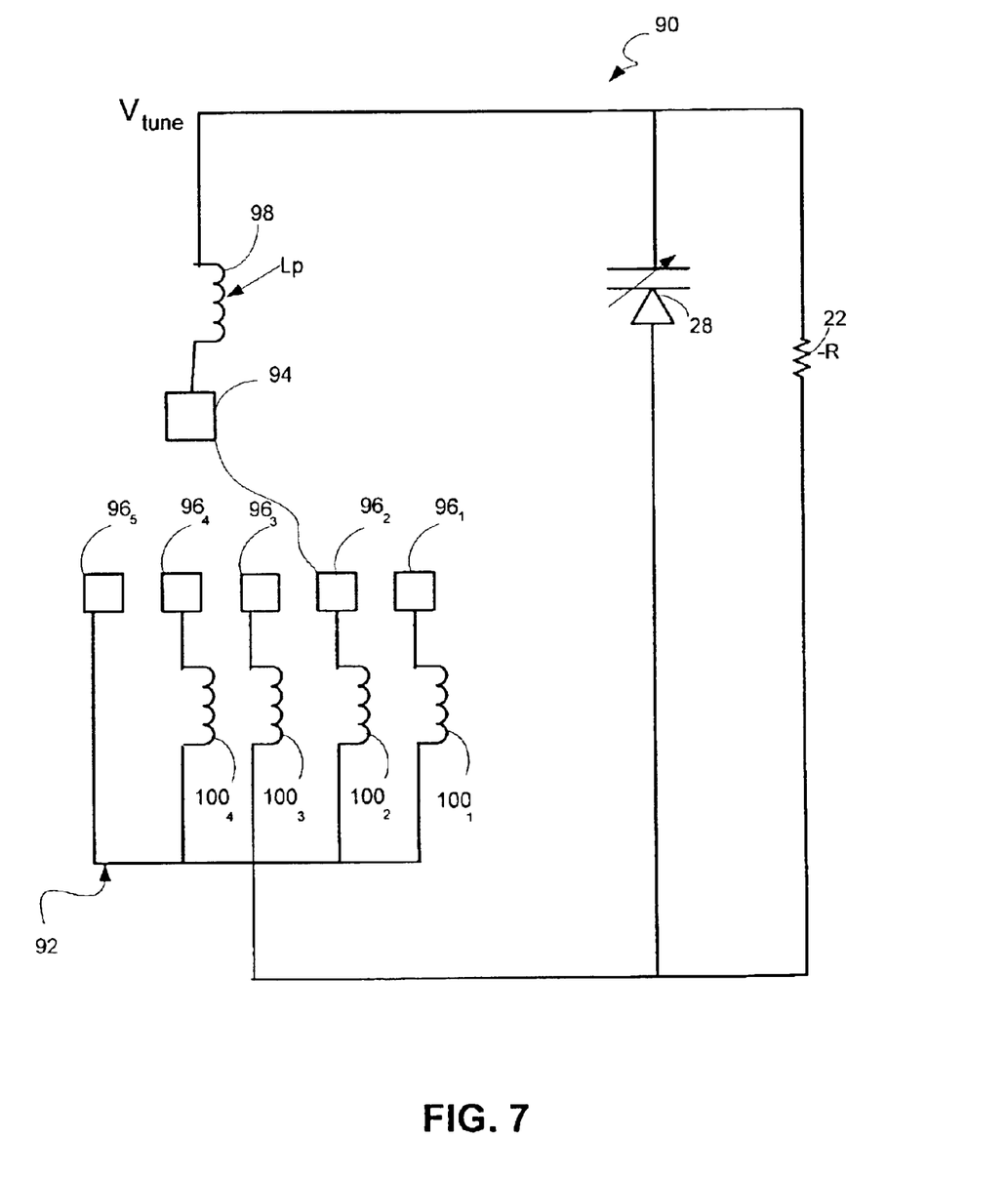
FIG. 7 is a schematic circuit diagram of another voltage-controlled oscillator using a variable inductance arrangement, different than that shown in FIG. 3, for an LC tank.

Referring to FIG. 7, a VCO 90 includes the active device 22, the varactor 28, and an inductance arrangement 92. The arrangement 92 includes a common bondpad 94, selectable bondpads $96_1$–$96_5$, a primary inductor 98, and secondary inductors $100_1$–$100_4$ coupled to respective selectable bondpads $96_1$–$96_4$. The primary and secondary inductors 98 and 100 are coil inductors and may be formed at different layers in the wafer 50. An inductance $L_p$ of the primary inductor 98 is designed to, when combined with an inductance of a bondwire 102 connected to the bondpad $96_5$ be used with the varactor 28 if the actual nominal varactor capacitance $C_{nom-act}$ is at a lower extreme of the tolerance range relative to the designed capacitance $C_{nom-des}$ (e.g., 90% of $C_{nom-des}$). The secondary inductors $100_1$, $100_2$, $100_3$ and $100_4$ are each designed to, when combined with an inductance of a bondwire 102 connected to the bondpads $96_1$, $96_2$, $96_3$, and $96_4$, respectively, be used with the varactor 28 if the actual nominal varactor capacitance $C_{nom-act}$ differs from the designed capacitance $C_{nom-des}$ by corresponding ranges. The range corresponding to pad $96_1$ is at the upper end of the tolerance range. The inductance of the secondary inductor $100_3$ coupled to bondpad $96_3$ is designed to be used, in combination with the primary inductor 98 and the bondwire inductance, with the varactor 28 if the varactor's actual capacitance $C_{nom-act}$ is within the acceptable range of actual nominal capacitances. Depending on the capacitances and inductances used, the primary inductor 98 may be eliminated.

Figure 8:
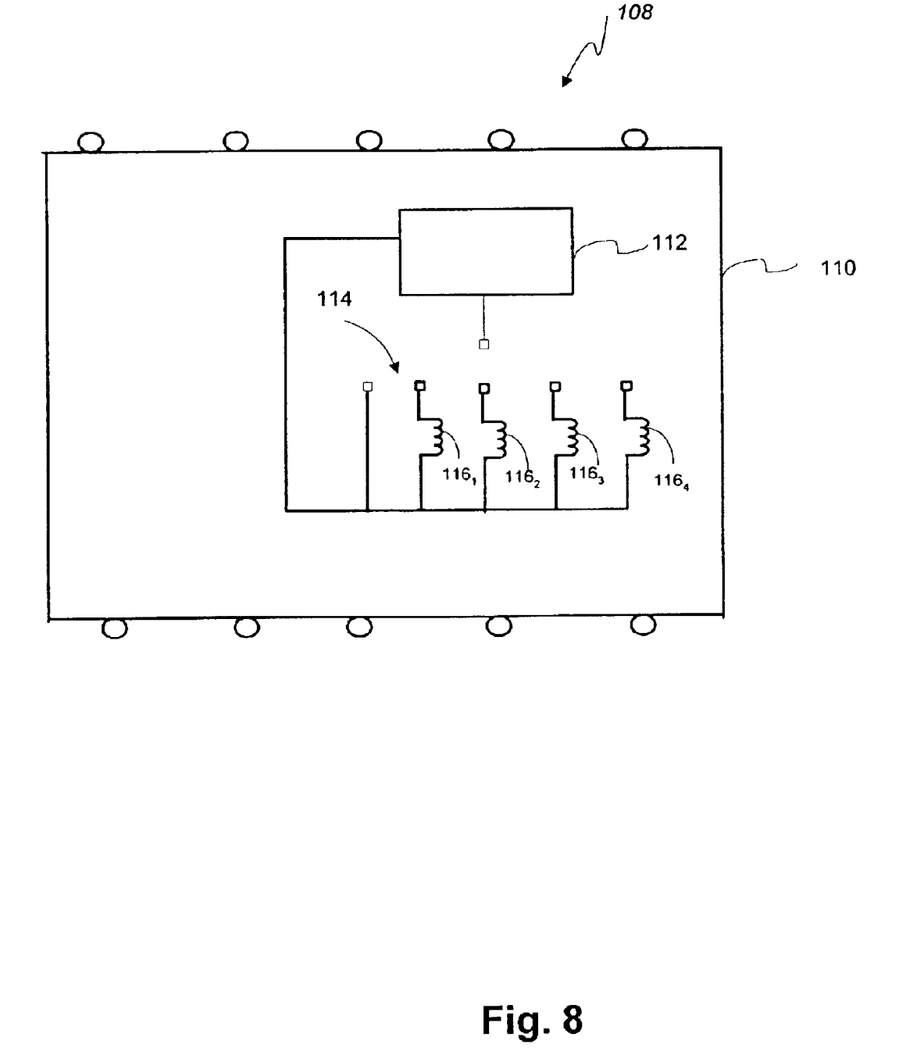
FIG. 8 is a schematic circuit diagram of another voltage-controlled oscillator using a variable inductance arrangement, different than those shown in FIGS. 3 and 7, for an LC tank.

Referring to FIG. 8, a system 108 includes an IC chip package 110, a die or chip 112 that includes a varactor and active device (not shown) for a VCO, and an inductance arrangement 114. The package 110 may be a printed circuit board (PCB). The inductance arrangement 114 is similar to the inductance arrangement 92, except that the arrangement 114 does not include a primary inductor (although a primary inductor could be used), and the inductances of inductors $116_1$–$116_4$ are designed accordingly. As shown, the arrangement is disposed off-chip (i.e., off of the chip 112). Coil inductors may be used for the inductors $116_1$–$116_4$.

Still further embodiments are within the scope and spirit of the invention and the appended claims. For embodiments with coil inductors (e.g., as shown in FIGS. 7 and 8), the inductors are trimmed or otherwise modified to be precise. Also, for such embodiments the selectable bondpads can be disposed equidistant from the common bondpad. Also, for arrangements with inductors in addition to the bondwire inductance, the inductances of the primary inductor (if any) and the secondary inductors are factored into the determination of which selectable bondpad to use.

While various embodiments of the application have been described, it will be apparent to those of ordinary skill in the art that many more embodiments and implementations are possible that are within the scope of this invention. Accordingly, the invention is not to be restricted except in light of the appended claims and their equivalents.

What is claimed is:

1. A voltage-controlled oscillator (VCO) comprising:
   an input configured to receive a tuning voltage;
   a capacitive element coupled to the input and having an actual capacitance C;
   a first connection point;
   a plurality of second connection points for coupling to the first connection point, at least one of the plurality of connection points being coupled to the first connection point by a bondwire of a length selected to provide a compensating inductance, at least the compensating inductance and the capacitive element being coupled to form a tank, the compensating inductance compensating for a deviation in the actual capacitance C from a desired capacitance of the capacitive element and affecting a total inductance L, that includes at least the compensating inductance, such that an LC product of the inductance L and the capacitance C is within a desired range of LC product values; and
   an output coupled to the tank and configured to carry an output signal having a frequency associated with the LC product.

2. The VCO of claim 1 wherein the first connection point comprises a first bondpad and the second connection points comprise a plurality of second bondpads, wherein the compensating inductance includes an inductance of a bondwire coupling the first bondpad to at least one of the plurality of second bondpads.

3. The VCO of claim 2 wherein each of the plurality of second bondpads is disposed a different distance away from the first bondpad relative to any other second bondpad.

4. The VCO of claim 2 wherein the compensating inductance includes an inductance of at least another bondwire.

5. The VCO of claim 2 further comprising a plurality of compensating inductors, each coupled to a respective second bondpad such that an electrical connection between the first bondpad and a selected second bondpad causes the compensating inductor coupled to the selected second bondpad to affect the total inductance.

6. The VCO of claim 5 further comprising a third bondpad coupled to other portions of the tank to bypass the compensating inductors.

7. The VCO of claim 5 wherein the input, the output, and the capacitive element are disposed on a common semiconducting die, and wherein the first bondpad, the second bondpads, and the compensating inductors are disposed on a substrate external to the die.

8. The VCO of claim 1 wherein the capacitive element is a varactor, the capacitance C is a capacitance of the varactor when the tuning voltage is at a center-frequency level, and the varactor is coupled to the input to receive the tuning voltage for adjusting a capacitance of the varactor.

9. The VCO of claim 1 wherein the compensating inductance includes at least the bondwire and a second inductive element coupled in series with the bondwire.

10. The VCO of claim 9 wherein the at least two inductive elements are coupled in series.

11. The VCO of claim 1 wherein the compensating inductance includes a tappable inductor, the plurality of connection options being different available tap points of the tappable inductor.

12. A voltage-controlled oscillator (VCO) comprising:
    an input configured to receive a tuning voltage;
    an LC-tank including:
    a varactor coupled to the input to receive the tuning voltage and having a capacitance C when the tuning voltage is at a nominal level;

a primary inductor; and inductance means for coupling different compensating inductances to the primary inductor, at least one of the different compensating inductances being coupled to the primary inductor to provide at least a portion of a total inductance L of the LC-tank, the primary inductor and the at least one compensating inductance being coupled to the varactor, the LC-tank having an oscillation center frequency within a desired range when the tuning voltage is at the nominal level; and an output coupled to the LC-tank and configured to carry an output signal having a frequency associated with the LC product;

wherein the inductance means includes a common bondpad, a plurality of selectable bondpads, and at least one bondwire connecting the common bondpad to at least one of the selectable bondpads.

13. The VCO of claim 12 wherein the selectable bondpads are disposed at different distances relative to the common bondpad.

14. The VCO of claim 12 wherein the inductance means includes compensating inductors coupled to the selectable bondpads, the compensating inductors having different inductance values.

15. A method of producing a circuit including a voltage-controlled oscillator (VCO), the method comprising:

providing VCO components including an input for receiving a tuning voltage, a varactor for receiving the tuning voltage, and an output for conveying an oscillating signal whose frequency is at least partially dependent upon a capacitance of the varactor;

completing at least one of a plurality of possible connections to the varactor to couple an inductance to the varactor to at least partially compensate for a difference between a desired capacitance and an actual capacitance of the varactor, which of the possible connections is completed being dependent upon knowledge of the difference between the desired and actual capacitances of the varactor.

16. The method of claim 15 wherein the completing of the at least one connection forms an LC tank having a center frequency of oscillation within a desired range of frequencies.

17. The method of claim 15 wherein the completing includes connecting a bondwire between a common bondpad and a plurality of selectable bondpads.

18. The method of claim 17 wherein the connecting includes forming a bondwire having a length dependent upon the difference between the desired capacitance and the actual capacitance of the varactor.

19. The method of claim 15 wherein the completing includes selectively coupling a compensating inductor to the varactor.

20. The method of claim 15 further comprising determining an indication of the difference between the desired capacitance and the actual capacitance of the varactor.

21. A method of making a chip including a voltage-controlled oscillator (VCO), the method comprising:

forming a wafer including VCO components including an input for receiving a tuning voltage, a common connection pad coupled to the input, a varactor for receiving the tuning voltage, multiple selectable connection pads coupled to the varactor, and an output for conveying an oscillating signal whose frequency is at least partially dependent upon a capacitance of the varactor;

determining a difference between an actual capacitance associated with the varactor and a designed capacitance of the varactor;

selecting one of the multiple selectable connection pads based on the determined difference; and wire bonding the common connection pad to the selected one of the multiple selectable connection pads.

22. The method of claim 21 wherein the wire bonding forms an LC tank having a center frequency of oscillation within a desired range of frequencies.

23. The method of claim 21 wherein the wire bonding forms a bondwire having a length dependent upon the determined difference.

24. The method of claim 21 wherein the wire bonding selectively couples a compensating inductor to the varactor.

25. The method of claim 15 wherein the selecting includes accessing stored indications relating the multiple selectable connection pads and differences between actual and designed varactor capacitances.

26. The method of claim 3 wherein a selected one of the second bondpads is disposed such that if a first bondwire is connected from the first bondpad to the selected one of the second bondpads, and the actual capacitance is at a first extreme of a tolerance range of capacitances, then an LC product of the actual capacitance and a corresponding first inductance of the first bondwire will be within an acceptable range of LC products, and wherein another selected one of the second bondpads is disposed such that if a second bondwire is connected from the first bondpad to the another selected one of the second bondpads, and the actual capacitance is at a second extreme of the tolerance range of capacitances, then an LC product of the actual capacitance and a corresponding second inductance of the second bondwire will be within the acceptable range of LC products.

* * * * *